US008809098B2

(12) United States Patent
Chuang et al.

(10) Patent No.: US 8,809,098 B2
(45) Date of Patent: Aug. 19, 2014

(54) BACK SIDE DEFECT REDUCTION FOR BACK SIDE ILLUMINATED IMAGE SENSOR

(71) Applicant: Taiwan Semiconductor Manufacturing Company, Ltd., Hsin-Chu (TW)

(72) Inventors: Chun-Chieh Chuang, Tainan (TW);
Dun-Nian Yaung, Taipei (TW);
Yeur-Luen Tu, Taichung (TW);
Jen-Cheng Liu, Hsin-Chu (TW);
Keng-Yu Chou, Kaohsiung (TW);
Chung Chien Wang, Shanhua Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/088,596

(22) Filed: Nov. 25, 2013

(65) Prior Publication Data
US 2014/0073080 A1    Mar. 13, 2014

Related U.S. Application Data

(62) Division of application No. 12/766,149, filed on Apr. 23, 2010, now Pat. No. 8,614,495.

(51) Int. Cl.
*H01L 31/18* (2006.01)
(52) U.S. Cl.
CPC .................... *H01L 31/1872* (2013.01)
USPC ........... 438/58; 257/75; 257/460; 257/E31.04
(58) Field of Classification Search
CPC .. H01L 31/18; H01L 31/1864; H01L 31/1872
USPC ................. 257/75, 460, 463, E31.04; 438/58
See application file for complete search history.

(56) References Cited

U.S. PATENT DOCUMENTS

| | | | |
|---|---|---|---|
| 5,043,785 A | 8/1991 | Mizutani et al. | |
| 5,646,432 A | 7/1997 | Iwaki et al. | |
| 7,112,465 B2 | 9/2006 | Goushcha et al. | |
| 7,498,650 B2 | 3/2009 | Lauxtermann | |
| 7,714,403 B2 | 5/2010 | Lee et al. | |
| 7,745,895 B2 | 6/2010 | Nagai et al. | |
| 7,781,715 B2 | 8/2010 | Uya et al. | |
| 7,858,431 B2 | 12/2010 | Isaka et al. | |
| 7,901,974 B2 | 3/2011 | Venezia et al. | |
| 8,008,169 B2 | 8/2011 | Ohnuma et al. | |
| 8,110,431 B2 * | 2/2012 | Rohatgi et al. | .................. 438/98 |
| 8,173,518 B2 | 5/2012 | Liu | |
| 8,178,422 B2 | 5/2012 | Hsu et al. | |
| 8,227,288 B2 | 7/2012 | Wang | |
| 8,319,867 B2 | 11/2012 | Mabuchi et al. | |
| 8,344,471 B2 | 1/2013 | Tseng et al. | |
| 8,415,725 B2 | 4/2013 | Hirota | |

(Continued)

*Primary Examiner* — Allan R Wilson
(74) *Attorney, Agent, or Firm* — Haynes and Boone, LLP

(57) ABSTRACT

Provided is an image sensor device. The image sensor device includes a substrate having a front side and a back side. The image sensor also includes a radiation-detection device that is formed in the substrate. The radiation-detection device is operable to detect a radiation wave that enters the substrate through the back side. The image sensor further includes a recrystallized silicon layer. The recrystallized silicon layer is formed on the back side of the substrate. The recrystallized silicon layer has different photoluminescence intensity than the substrate.

20 Claims, 7 Drawing Sheets

(56) References Cited

U.S. PATENT DOCUMENTS

| | | |
|---|---|---|
| 8,436,443 B2 | 5/2013 | Hsu et al. |
| 8,502,335 B2 | 8/2013 | Tseng et al. |
| 2008/0079108 A1 | 4/2008 | Hsu et al. |
| 2008/0217724 A1 | 9/2008 | Uya |
| 2008/0224247 A1* | 9/2008 | Hsu et al. ............ 257/432 |
| 2009/0165854 A1 | 7/2009 | Yamazaki et al. |
| 2010/0237451 A1* | 9/2010 | Murakoshi ............ 257/432 |
| 2010/0243868 A1 | 9/2010 | Liu |
| 2011/0260221 A1* | 10/2011 | Mao et al. ............ 257/291 |

* cited by examiner

BACK SIDE DEFECT REDUCTION FOR BACK SIDE ILLUMINATED IMAGE SENSOR

PRIORITY DATA

This application is a divisional patent application of U.S. patent application Ser. No. 12/766,149, filed on Apr. 23, 2010, entitled "Back Side Defect Reduction for Back Side Illuminated Image Sensor," the disclosure of which is hereby incorporated by reference in its entirety.

FIELD OF THE INVENTION

The present disclosure relates generally to a semiconductor device, and more particularly, to a semiconductor image sensor device.

BACKGROUND

Semiconductor image sensors are used for sensing light. Complementary metal-oxide-semiconductor (CMOS) image sensors (CIS) and charge-coupled device (CCD) sensors are widely used in various applications such as digital still camera or mobile phone camera applications. These devices utilize an array of pixels in a substrate, including photodiodes and transistors, that can absorb radiation projected toward the substrate and convert the sensed radiation into electrical signals.

A back side illuminated (BSI) image sensor device is one type of image sensor device. Fabrication of the BSI image sensor device typically requires a thinning process to reduce the thickness of the substrate. A polishing process is also typically performed after (or as a part of) the thinning process to make sure that the back side of the BSI image sensor device is smooth and flat. However, the thinning process and the polishing process may lead to defects in the BSI image sensor device, especially near the back side of the substrate. These defects may cause dark currents and white pixels, which degrade image quality and performance of the BSI image sensor device. Existing fabrication methods of BSI image sensor devices may not be able to sufficiently address these problems.

Therefore, while existing methods of fabricating BSI image sensor devices have been generally adequate for their intended purposes, they have not been entirely satisfactory in every aspect.

SUMMARY

One of the broader forms of the present disclosure involves an image sensor device that includes: a substrate having a front side and a back side; a radiation-detection device formed in the substrate, the radiation-detection device being operable to detect a radiation wave that enters the substrate through the back side; and a recrystallized silicon layer formed on the back side of the substrate, the recrystallized silicon layer having different photoluminescence intensity than the substrate.

Another of the broader forms of the present disclosure involves an image sensor device that includes: a substrate having: a front surface; a back surface opposite the front surface; and first and second portions that are mutually exclusive, the first portion being disposed adjacent to the back surface, the second portion being disposed between the first portion and the back surface, wherein the first portion is substantially less resistive than the second portion; and a radiation-sensing region disposed in the substrate, the radiation-sensing region being operable to sense radiation projected toward the radiation-sensing region through the back surface.

Still another of the broader forms of the present disclosure involves a method of fabricating an image sensor device, the method includes: providing a substrate having a front side and a back side; forming a radiation-sensing region in the substrate, the radiation-sensing region being operable to sense radiation projected toward the radiation-sensing region through the back side; and thereafter annealing the substrate in a manner so that a portion of the substrate near the back side is melted.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
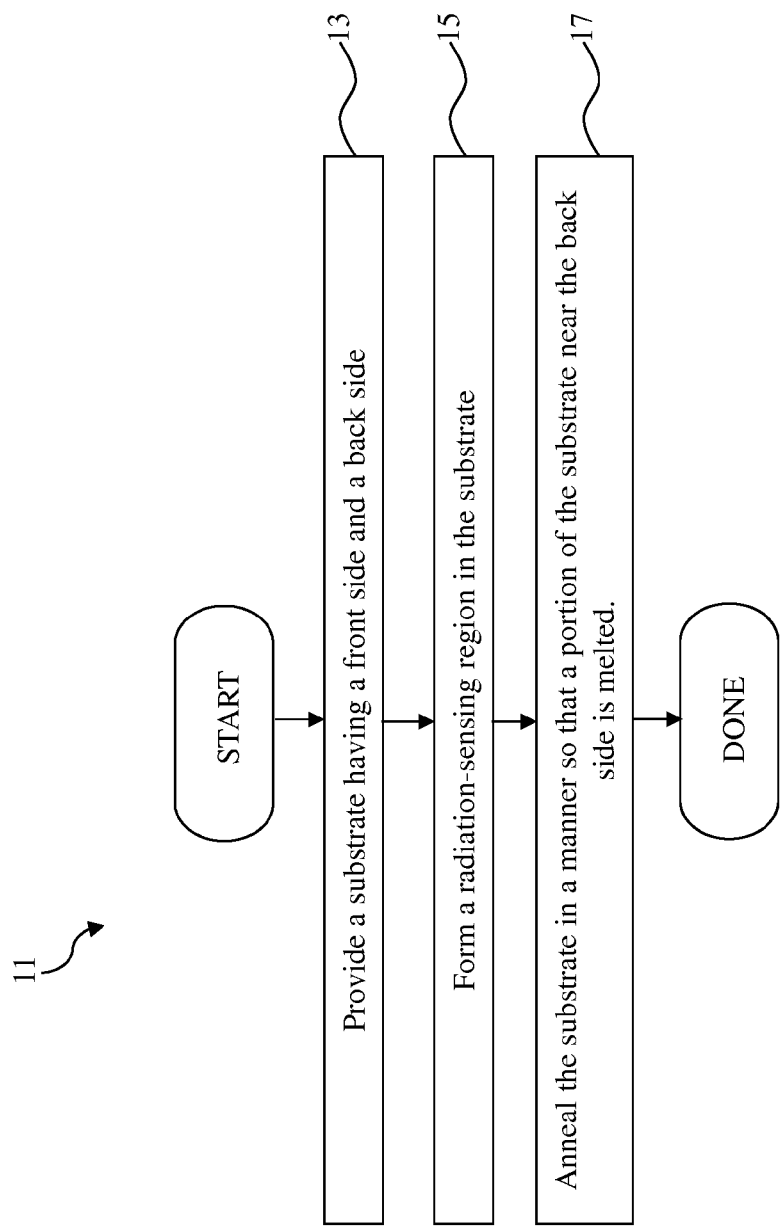
FIG. 1 is a flowchart illustrating a method for fabricating a semiconductor device according to various aspects of the present disclosure.

Illustrated in FIG. 1 is a flowchart of a method 11 for fabricating a back-side illuminated (BSI) image sensor device according to various aspects of the present disclosure. Referring to FIG. 1, the method 11 begins with block 13 in which a substrate having a front side and a back side is provided. The method 11 continues with block 15 in which a radiation-sensing region is formed in the substrate. The radiation-sensing region is operable to sense radiation projected toward the radiation-sensing region from the back side. The method 11 continues with block 17 in which the substrate is annealed in a manner so that a portion of the substrate near the back side is melted.

FIGS. 2 to 6 are diagrammatic fragmentary cross-sectional side views of an apparatus that includes a BSI image sensor device 30 at various stages during its fabrication according to an embodiment of the method 11 of FIG. 1. It is understood that FIGS. 2 to 6 have been simplified for a better understanding of the inventive concepts of the present disclosure.

Figure 2:
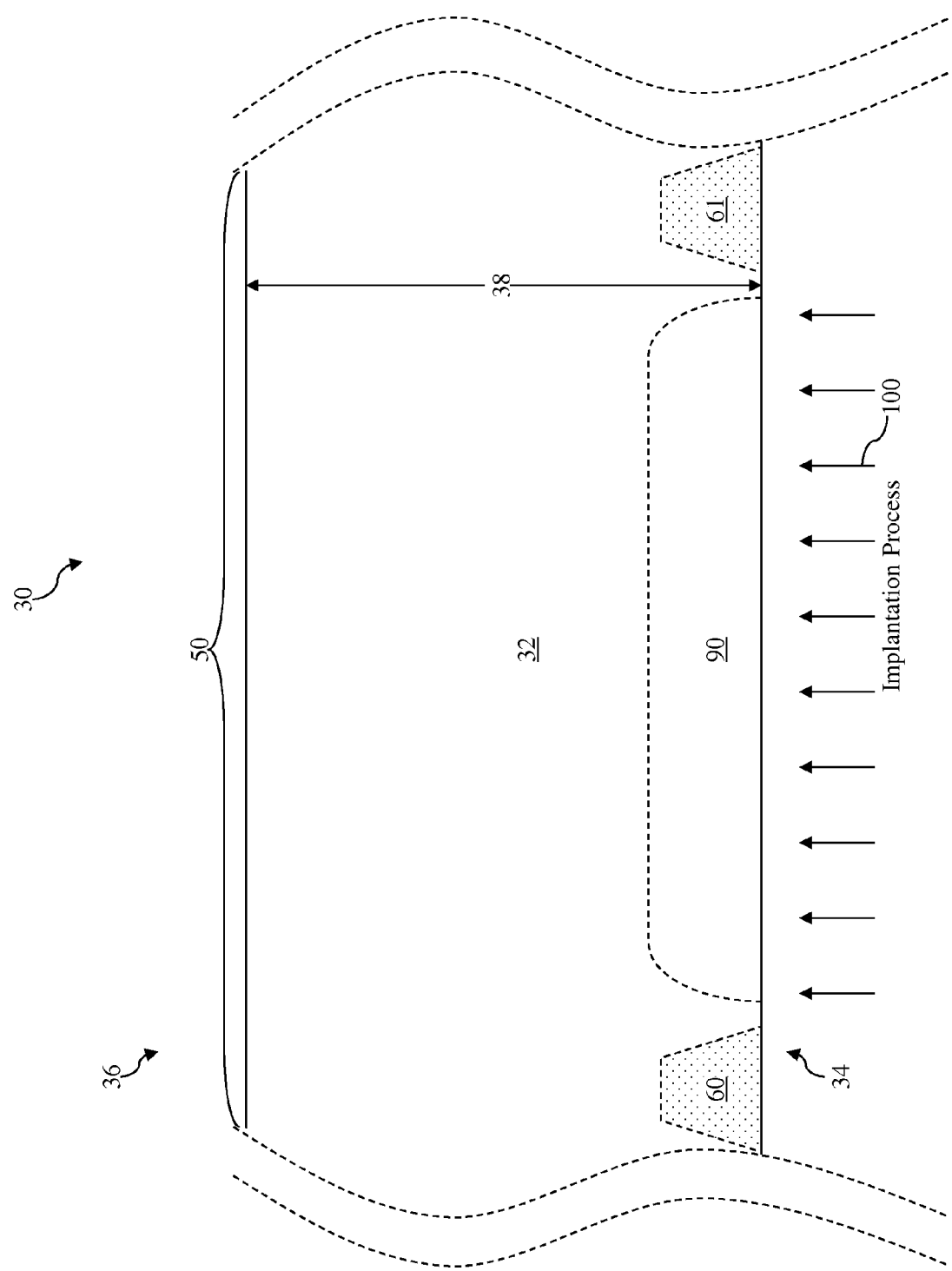
FIGS. 2-6 are diagrammatic fragmentary cross-sectional side views of a semiconductor device at various stages of fabrication in accordance with an embodiment of the method illustrated in FIG. 1.

Referring to FIG. 2, the image sensor device 30 includes a substrate 32, also referred to as a device substrate. The substrate 32 is a silicon substrate doped with a P-type dopant such as boron, in which case the substrate 32 is a P-type substrate. Alternatively, the substrate 32 could be another suitable semiconductor material. For example, the substrate 32 may be a silicon substrate that is doped with an N-type dopant such as phosphorous or arsenic, in which case the substrate 32 is an N-type substrate. The substrate 32 may include other elementary semiconductors such as germanium and diamond. The substrate 32 may optionally include a compound semiconductor and/or an alloy semiconductor. Further, the substrate 32 may include an epitaxial layer (epi layer), may be strained for performance enhancement, and may include a silicon-on-insulator (SOI) structure.

The substrate 32 has a front side 34 and a back side 36. To facilitate the ensuing discussions, the substrate 32 is shown in a vertically "flipped upside down". In other words, the substrate 32 is shown such that the front side 34 is closer to the bottom of FIG. 2, and the back side 36 is closer to the top of FIG. 2. The front side 34 may also be referred to as a front surface, and the back side 36 may also be referred to as a back surface. The substrate 32 has an initial thickness 38 that is in a range from approximately 100 microns (um) to approximately 3000 um. In an embodiment, the initial thickness 38 is approximately 700 um.

The substrate 32 includes various regions, which may include a pixel-array region, a periphery region, a bonding pad region, and a scribe line region. The pixel-array region contains arrays of radiation-sensing pixels. Each pixel may include a radiation-sensing device that can sense or detect radiation having specific wavelengths, which may correspond to lights of different colors. The periphery region includes devices that need to be kept optically dark. These devices may be digital devices, such as application-specific integrated circuit (ASIC) devices or system-on-chip (SOC) devices. The devices in the periphery region may also be reference pixels that are used to establish a baseline of an intensity of light for the image sensor device 30.

The bonding pad region is where one or more bonding pads of the image sensor device 30 will be formed. The bonding pads allow electrical connections to be established between the image sensor device 30 and external devices. The scribe line region includes regions that contain boundaries between various adjacent semiconductor dies. The scribe line region is cut therethrough in a later fabrication process to physically separate these adjacent dies, before the dies are packaged and sold as integrated circuit chips. For the sake of simplicity, the periphery region, the bonding pad region, and the scribe line region are not illustrated. FIG. 2 only illustrates one example pixel 50 from the pixel-array region of the substrate 32. However, it is understood that any number of pixels may be implemented in the pixel-array region, and that these other pixels may be implemented differently from the pixel 50. The approximate boundaries of the pixel 50 are shown as broken curved lines in FIG. 2.

Isolation structures 60 and 61 are formed in the substrate 32 to define boundaries of the pixel 50. The isolation structures 60 and 61 include shallow trench isolation (STI) features. The isolation structures 60 and 61 may alternatively include deep trench isolation features or doped isolation features. It is also understood that the isolation structures 60 and 61 may include a suitable combination of STI features, deep trench isolation features, and doped isolation features.

In an embodiment where the isolation structures 60 and 61 are STI features or deep trench isolation features, they are formed by etching openings (or trenches) from the front side 34 of the substrate 32 and thereafter filling the openings with a dielectric material, such as an oxide material or a nitride material, or combinations thereof. Although not illustrated for the sake of simplicity, the isolation structures 60 and 61 may be surrounded by a shallow well and a deep well, both of which may have the same doping polarity as the substrate 32. Stated differently, if the substrate 32 is doped with a P-type dopant, then the shallow and deep wells are also doped with a P-type dopant, and vice versa. In another embodiment where the isolation structures 60 and 61 include doped isolation features, these doped isolation features may be formed by doping the substrate from the front side 34 using a dopant that has an opposite doping polarity as the radiation-sensing region 90. Thus, if the radiation-sensing region 90 is N-type, the dopant used to form the doped isolation features is a P-type dopant.

A radiation-sensing region (or device) 90 is then formed in the substrate 32 as a part of the pixel 50. The radiation-sensing region 90 is formed between the isolation structures 60 and 61. The radiation-sensing region 90 is formed by performing an ion implantation process 100 on the substrate 32 from the front side 34. The ion implantation process 100 implants the substrate 32 with a dopant having an opposite doping polarity as the substrate 32. For example, in an embodiment where the substrate 32 is a P-type substrate, the radiation-sensing regions 90 is doped with an N-type dopant. In another embodiment where the substrate 32 is an N-type substrate, the radiation-sensing regions 90 is doped with a P-type dopant.

In the embodiment shown in FIG. 2, the radiation-sensing region 90 is formed adjacent to or near the front side 34 of the substrate 32. In alternative embodiments, depending on the design needs and manufacturing requirements, the radiation-sensing region 90 may be formed further away from the front side 34. The position or location of the radiation-sensing region 90 may be adjusted by tuning an implantation energy level of the implantation process 100. For example, a higher implantation energy level results in a deeper implant, which means the radiation-sensing region 90 is formed further away from the front side 34. Similarly, a smaller implantation energy level causes the radiation-sensing region 90 to be formed closer to the front side 34.

The radiation-sensing region 90 is operable to sense or detect a radiation wave projected toward the radiation-sensing region 90 through the back side 36 of the substrate 32. In an embodiment, the radiation-sensing region 90 includes a pinned photodiode. In other embodiments, the radiation-sensing region 90 may include other types of photodiodes, photogates, reset transistors, source follower transistors, or transfer transistors. For the sake of simplicity, the structural details of the radiation-sensing region 90 are not illustrated.

During the operation of the image sensor device 30, noise such as cross-talk may occur. For example, electrical cross-talk occurs when charge carriers spread/diffuse from the pixel 50 into neighboring pixels (not illustrated), or vice versa. As another example, optical cross-talk occurs when photons from the radiation waves that are intended to be received by one pixel end up being received by an unintended neighboring pixel. Left unabated, the electrical or optical cross-talk will degrade the performance of the image sensor device 30. Here, the isolation structures 60 and 61 provide sufficient isolation between the pixel 50 and neighboring pixels, thus substantially reducing electrical and optical cross-talk.

Figure 3:
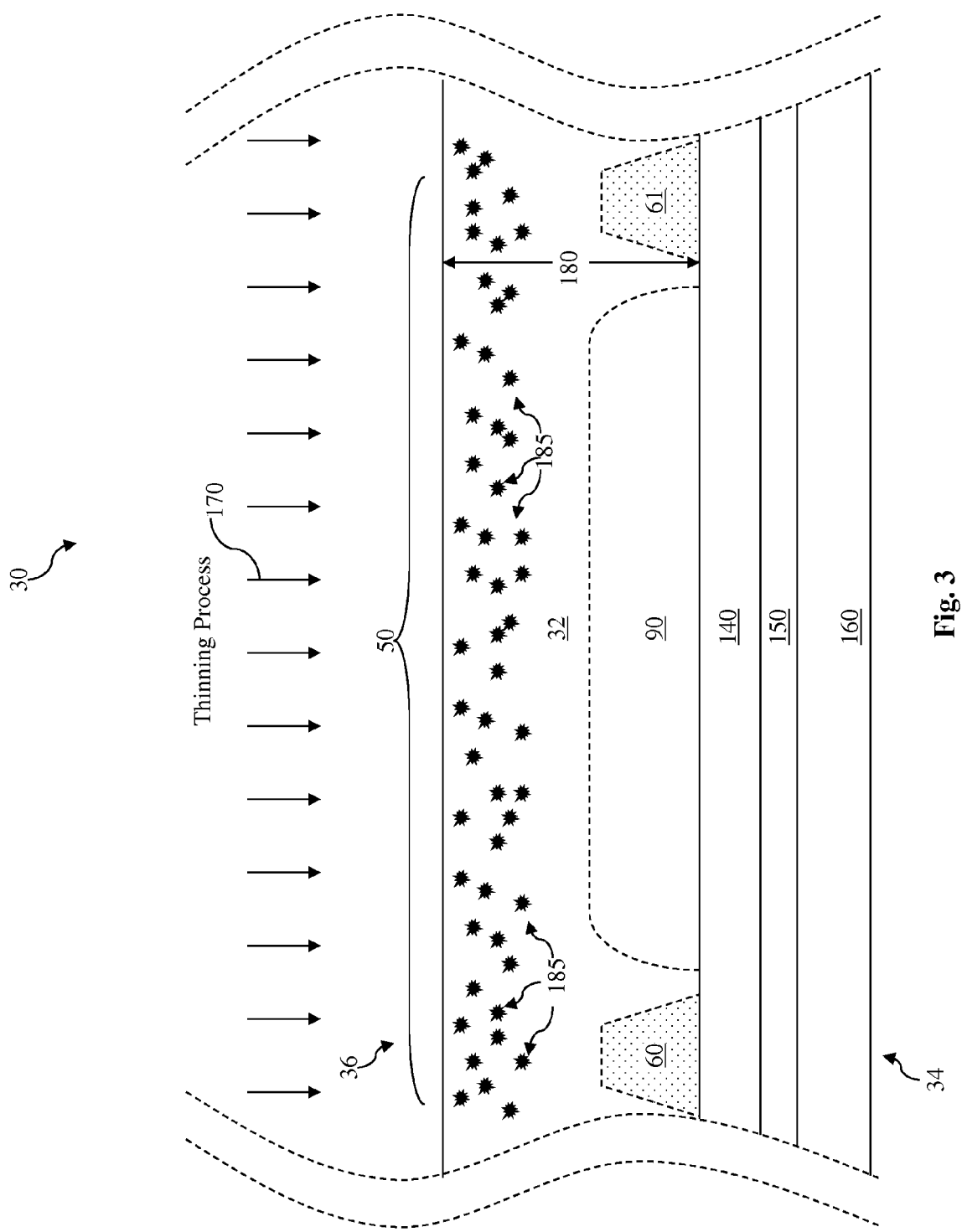

Referring now to FIG. 3, an interconnect structure 140 is formed over the front side 34 of the substrate 32. The interconnect structure 140 includes a plurality of patterned dielectric layers and conductive layers that provide interconnections (e.g., wiring) between the various doped features, circuitry, and input/output of the image sensor device 30. The interconnect structure 140 includes an interlayer dielectric (ILD) and a multilayer interconnect (MLI) structure formed in a configuration such that the ILD separates and isolates each MLI structure from other MLI structures. The MLI structure includes contacts, vias and metal lines formed on the substrate 32.

In one example, the MLI structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (PVD), chemical vapor deposition (CVD), or combinations thereof. Other manufacturing techniques to form the aluminum interconnect may include photolithography processing and etching to pattern the conductive materials for vertical connection (via and contact) and horizontal connection (conductive line). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect may be formed by a technique including CVD, sputtering, plating, or other suitable processes.

A buffer layer 150 is formed on the interconnect structure 140. In an embodiment, the buffer layer 150 includes a dielectric material such as silicon oxide. Alternatively, the buffer layer 150 may optionally include silicon nitride. The buffer layer 150 is formed by CVD, PVD, or other suitable techniques. The buffer layer 150 is planarized to form a smooth surface by a chemical-mechanical-polishing (CMP) process.

A carrier substrate 160 is then bonded with the buffer layer 150 so that processing of the back side 36 of the substrate 32 can be performed. The carrier substrate 160 is bonded to the buffer layer 150 by molecular forces. The carrier substrate 160 may be similar to the substrate 32 and includes a silicon material. Alternatively, the carrier substrate 160 may optionally include a glass substrate. The carrier substrate 160 provides protection for the various features formed on the front side 34 of the substrate 32. The carrier substrate 160 also provides mechanical strength and support for processing the back side 36 of the substrate 32, which will be discussed below. It is understood that an annealing process may optionally be performed to enhance bonding strength. The buffer layer 150 provides electrical isolation between the substrate 32 and the carrier substrate 160.

Thereafter, a thinning process 170 (also referred to as a thin down process) is performed to thin the substrate 32 from the back side 36. In an embodiment, the thinning process 170 includes a CMP process. The thinning process 170 may also include a diamond scrubbing process, a grinding process, or other suitable techniques. A substantial amount of material may be removed from the substrate 32 by the process 170. After the thinning process 170 is performed, the substrate 32 has a thickness 180, which is in a range from approximately 1 um to approximately 6 um.

The thinning process 170 may cause a plurality of defects 185 to appear in the substrate 32, particularly near the back side 36 of the substrate 32. These defects 185 may extend relatively deep into the substrate 32, for example about several hundred nanometers (nm) into the substrate 32. These defects 185 may be physical defects or electrical defects and may trap carriers such as electrons. The trapped carriers may produce leakage current. Leakage current is problematic for image sensors such as the image sensor device 30. For example, with a sufficient amount of leakage current, the radiation-sensing region 90 may falsely detect "light", even when the image sensor device 30 is placed in an optically dark environment. Alternatively stated, the pixel 50 may end up "sensing" light when it shouldn't have (since there is actually no light). In this situation, the leakage current may be referred to as a "dark current", and the pixel 50 may become what is referred to as a "white pixel".

The existence of dark current and white pixels degrades the performance of the image sensor device 30 and is therefore undesirable. Previous BSI image sensor fabrication processes may not be able to adequately remove the defects 185 that cause the dark current and the white pixels. In comparison, the embodiments of the present disclosure offer a solution to substantially reduce dark current and white pixels. This technique will be discussed in detail further below.

Figure 4:
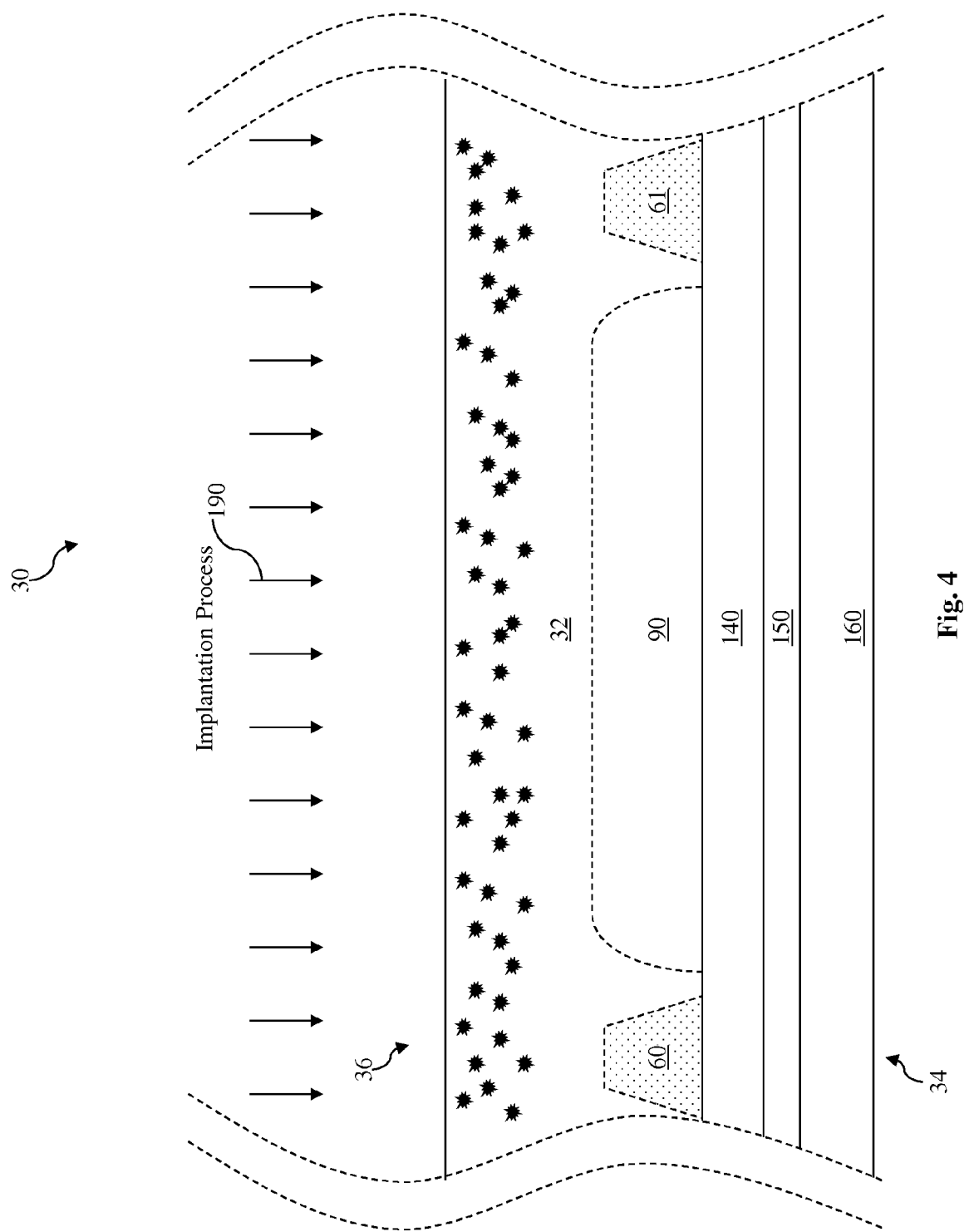

Referring now to FIG. 4, an implantation process 190 is performed to implant a dopant into the substrate 32 through the back side 36. The dopant may be a plurality of dopant ions, such as boron ions, phosphorous ions, or arsenic ions. The type of dopant used in the implantation process 190 may vary depending on design needs. For example, if an effective radiation-sensing area of the radiation-sensing region 90 needs to be expanded, then the dopant of the implantation process 190 is chosen to have the same doping polarity as the radiation-sensing region 90 (and thus an opposite doping polarity as the substrate 32). If a carrier potential needs to be increased, then the dopant of the implantation process 190 is chosen to have the same doping polarity as the substrate 32 (and thus an opposite doping polarity as the radiation-sensing region 90). In an embodiment, a P-type dopant such as boron (B) or boron difluoride ($BF_2$) is used as the dopant for the implantation process 190. The implantation energy is in a range from approximately 0.1 kilo electron-volts (KeV) to approximately 50 KeV. The implantation dosage is in a range from approximately $1 \times 10^{12}$ atoms/cm$^2$ to approximately $1 \times 10^{15}$ atoms/cm$^2$.

Figure 5:
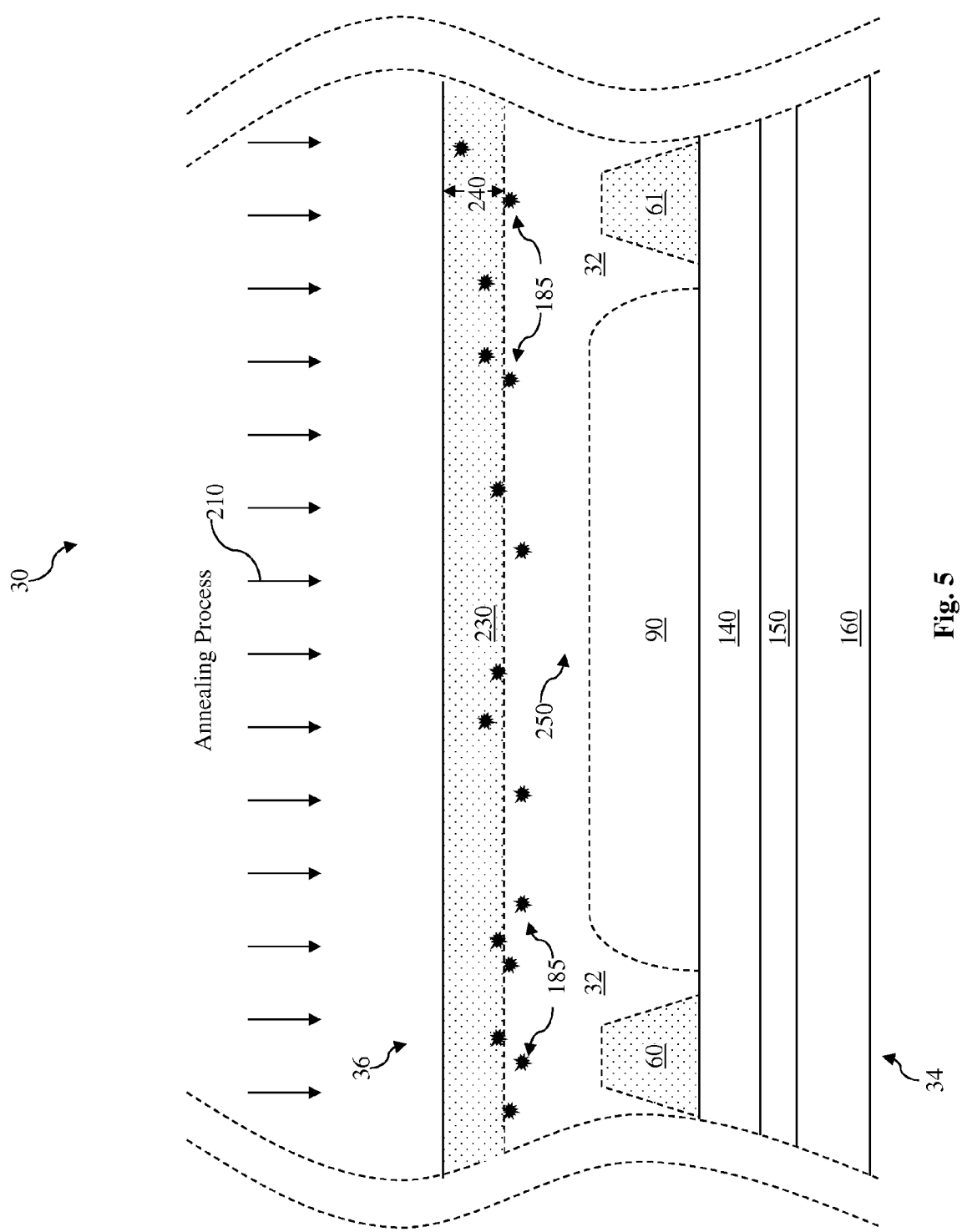

Referring now to FIG. 5, an annealing process 210 is performed to the back side 36 of the substrate 32. In an embodiment, the annealing process 210 is a laser annealing process and can reach an annealing temperature that is sufficiently high to melt portions of the substrate 32 near the back side 36. For example, in an embodiment where the substrate 32 includes silicon, the annealing process 210 may reach an annealing temperature of approximately 1414 degrees Celsius, which is sufficiently high to melt silicon. As a result, a portion 230 of the substrate 32 near the back side 36 is melted.

The portion 230 has a melting depth 240 that is measured from (or against) the back side 36 of the substrate 32. The melting depth 240 is generally correlated with the duration and the amount of annealing energy used in the annealing process 210. A longer duration or a higher annealing energy typically results in a deeper melting depth 240. Therefore, the melting depth 240 may be controlled by adjusting the annealing duration and energy, but only to a certain extent. This is partially due to the fact that the melting depth 240 may be capped at a maximum melting depth. When this maximum melting depth is reached, the melting depth 240 may not grow even if the annealing duration or the annealing energy are increased. One reason for this is that the temperature inside the substrate 32 quickly decays at deeper depths into the substrate 32 (moving further away from the back side 36). At regions of the substrate 32 beyond the maximum melting depth, the temperature at those regions may not be sufficiently high to melt silicon.

Further, as a practical concern, the annealing duration and annealing energy may be constrained by other factors. For example, if the melted depth 240 is too high, then the pixel 50 may not be able to absorb and detect radiation having relatively small wavelengths, such as blue light (wavelength being in a range from about 450 nm to about 490 nm). As another example, the fabrication process may have allocated a thermal budget to the image sensor device 30. Thermal budget defines a total amount of thermal energy transferred to the wafer (on which the image sensor device 30 is fabricated) during elevated temperature processes. If the thermal energy delivered to the wafer exceeds the allocated thermal budget, the devices on the wafer may be damaged and may become unoperational. Thus, the annealing duration and annealing energy may also be practically limited by the available thermal budget even before the theoretical maximum melting depth can be reached.

Here, the implantation process 190 (FIG. 4) facilitates the annealing process 210. In particular, the dopant implanted into the substrate 32 by the implantation process 190 will result in a lower effective melting temperature of the substrate 32, as well as a greater melting depth 240. Stated differently, because the substrate 32 is doped near the back side 36, the actual annealing temperature may not need to reach 1414 degrees Celsius to melt the silicon near the back side 36 of the substrate 32, which helps lower (or meet) the thermal budget. Also due to the implantation, the melted portion 230 may achieve a greater melting depth 240 than if the implantation process 190 had never been performed.

To provide some example values, the annealing process 210 in an embodiment has a duration that is in a range from approximately 10 nanoseconds (ns) to approximately 1000 ns, and has an annealing energy level that is in a range from approximately 0.5 J/cm$^2$ to approximately 5 J/cm$^2$. In that embodiment, the resulting melting depth 240 is in a range from approximately 5 nm to approximately 200 nm.

The annealing process 210 causes the silicon in the portion 230 of the substrate 32 to melt and to recrystallize. Thus the portion 230 may also be referred to as a recrystallized layer 230. Due to the implantation process 190 (FIG. 4), the recrystallized layer 230 is significantly more heavily doped than the rest of the substrate 32, for example by several orders of magnitude, each order of magnitude being a factor of ten. In an embodiment, the dopant concentration level of the recrystallized layer 230 is in a range from approximately $1 \times 10^{18}$ atoms/cm$^3$ to approximately $1 \times 10^{21}$ atoms/cm$^3$.

The recrystallized layer 230 also possesses other different physical characteristics compared to silicon that has not been melted, such as a region 250 of the substrate 32 that is between the recrystallized layer 230 and the radiation-sensing region 90. As an example, the recrystallized layer 230 has a different level of photoluminescence intensity compared to the region 250. Photoluminescence is a process in which a substance (such as silicon) absorbs photons into the substance and subsequently re-emits photons out of the substance. In quantum mechanical terms, this phenomenon may be viewed as an excitation to a higher energy state followed by a return to a lower energy state. The return to the lower energy state causes a photon to be emitted out of the substance. In an embodiment, the recrystallized layer 230 has a greater level of photoluminescence intensity than the region 250.

As another example, the recrystallized layer 230 has substantially lower resistivity (in the form of a sheet resistance) compared to unmelted silicon, such as the region 250. The resistivity of the recrystallized layer 230 may be several orders of magnitudes lower than the resistivity of the region 250. In some embodiments, the resistivity of the recrystallized layer 230 may be even lower than the resistivity of the radiation-sensing region 90.

The embodiments described herein offer advantages compared to traditional BSI image sensor fabrication methods. It is understood, however, that other embodiments may offer different advantages, and that no particular advantage is required for any embodiment. One advantage is that a deeper melting depth may be achieved without sacrificing the thermal budget. As discussed above, it may be desirable to achieve a predetermined melting depth, which may require a certain amount of annealing time and energy. This amount of annealing time and energy may cause the thermal budget to be exceeded. Here, since the dopant implanted by the implantation process 190 reduces silicon melting temperature and increases the melting depth 240, a deeper recrystallized silicon layer 230 may be achieved even if a smaller energy laser is used and for a shorter duration. Consequently, the thermal budget is not exceeded.

Another advantage is that the melted silicon frees up many of the trapped carriers that are associated with the defects 185. As a result, the defects 185 inside the recrystallized layer 230 are substantially reduced. Therefore, another advantage of the embodiments described herein is that the relatively deep melting depth 240 substantially reduces the defects 185 in the substrate 32. Consequently, the amount of dark current and the number of white pixels of the image sensor device 30 are reduced as well.

Figure 6:
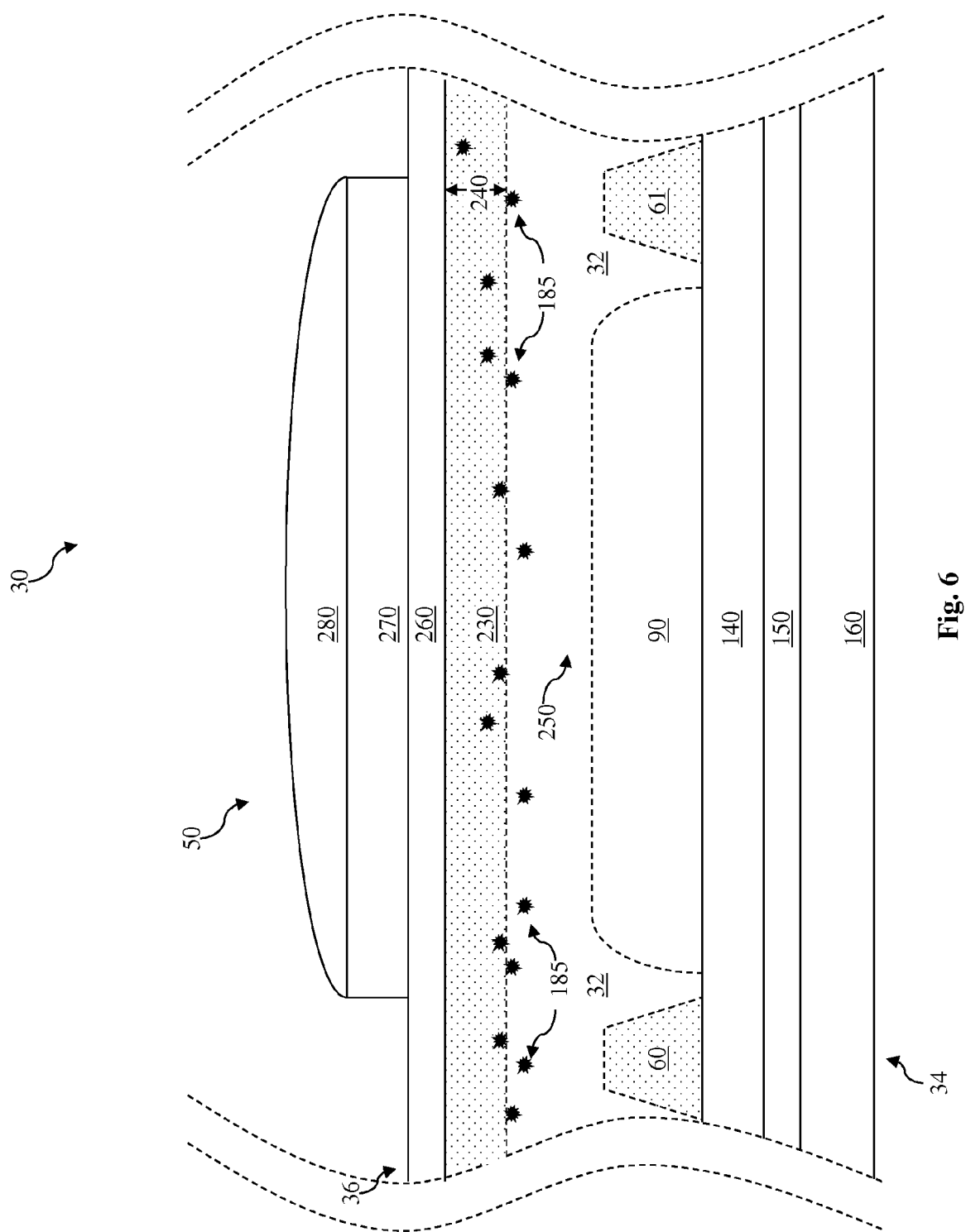

Referring now to FIG. 6, an anti-reflective layer 260 is formed over the recrystallized layer 230. The anti-reflective layer 260 serves to reduce reflection of radiation waves projected toward the back side 36. Thereafter, a color filter 270 is formed over the anti-reflective layer 260. The color filter 270 can support the filtering of radiation waves having a particular range of wavelengths, which may correspond to a particular light color, for example red, green, or blue. Thus, the color filter 270 may be used to only allow light having a predetermined color to reach the radiation-sensing region 90. Meanwhile, other pixels similar to the pixel 50 (not illustrated) may have filters designed such that different colored light may be detected by their respective radiation-sensing regions. To achieve the filtering of specific wavelength bands, the color filter 270 may include a dye-based (or pigment based) polymer or resin.

After the color filter 270 is formed, a micro lens 280 is formed over the color filter 270 for directing projected radiation toward the radiation-sensing region 90. The micro lens 280 may be positioned in various arrangements and have various shapes depending on a refractive index of material used for the micro-lens 280 and distance from the surface of the image sensor device 30. It is also understood that a micro lens similar to the micro lens 280 may be implemented for each of the other un-illustrated pixels.

Further, although not illustrated for the sake of simplicity, it is understood that the image sensor device 30 may include a charge-coupled device (CCD), complimentary metal oxide semiconductor (CMOS) image sensor (CIS), an active-pixel sensor (APS), or a passive-pixel sensor. The image sensor device 30 may further include additional circuitry and input/outputs that are provided adjacent to the pixels (such as the pixel 50) for providing an operational environment for the pixels and for supporting external communication with the pixels.

Figure 7:
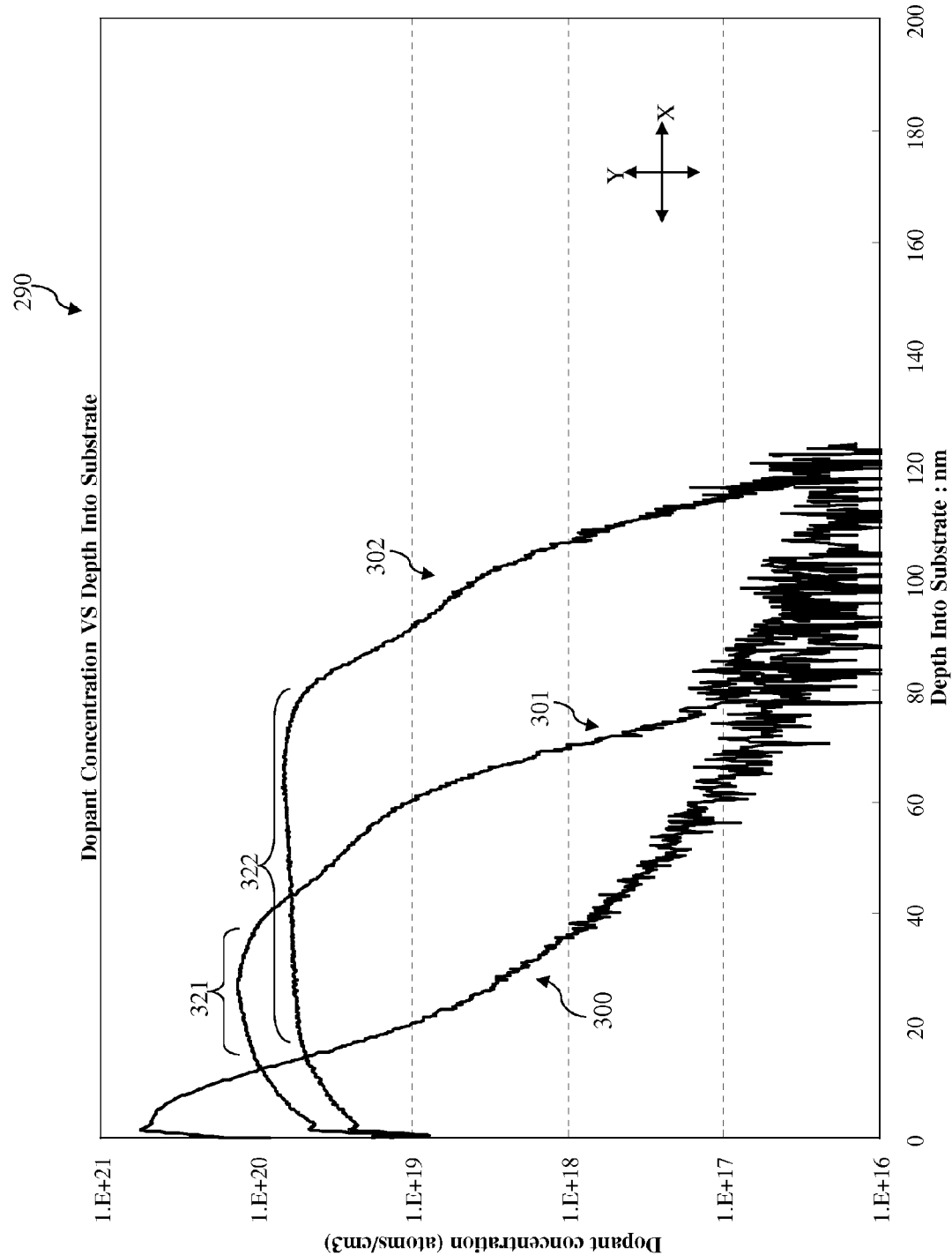
FIG. 7 is a chart illustrating a graph that shows a relationship between dopant concentration levels and depths into a substrate at which the dopant concentration levels are measured.

FIG. 7 is a graphical chart 290 illustrating how dopant concentration levels vary with respect to depths into a substrate, and with respect to the amount of annealing energy. FIG. 9 is also described with reference to FIGS. 4-5. Referring to FIG. 9, an X-axis of the chart 290 represents different depths into the substrate, where each depth into the substrate is measured from (or against) the back side of the substrate. A Y-axis of the chart 290 represents different dopant concentration levels.

Three curves 300, 301, and 302 are shown in the chart 290. The values of the curves 300-302 are extracted from sample BSI image sensor devices that were fabricated using different fabrication methods. The curves 300-302 each include a plurality of points, where each point is associated with its depth into the substrate (X value) as well as its respective dopant concentration level (Y value).

In more detail, the curve 300 is a plot of dopant concentration levels with respect to depths into the substrate where the annealing process 210 was not performed. The curve 301 is a plot of dopant concentration values with respect to depths into the substrate where the annealing process 210 was performed using an annealing energy of approximately 1.85 J/cm$^2$. The curve 302 is a plot of dopant concentration values with respect to depths into the substrate where the annealing process 210 was performed using an annealing energy of approximately 2.05 J/cm$^2$. Substantially similar implantation processes were performed for each of the curves 300-302.

As can be seen from FIG. 7, for the curve 300, the dopant concentration level declines rapidly as the depth into the substrate increases. Since the annealing process 210 was never performed, portions of the substrate near the back side is not melted. The implantation process performed to the back side of the substrate may have implanted a high concentration of dopant ions into the substrate, particularly regions of the substrate near the back side. But the absence of subsequent annealing means that these dopant ions are "stuck" in the regions where they were implanted. This explains why the dopant concentration levels are extremely high near the back side (where the depth into the substrate is small). In fact, the dopant concentration levels for the curve 300 may even exceed a normal saturation dopant concentration level when the depth into the substrate is less than approximately 10 nm.

In comparison, the curves 301 and 302 each have a somewhat flat "platform" region, (flat band) which are designated with reference numerals 321 and 322, respectively. The dopant concentration level in each of these platform regions 321 and 322 do not appear to have any correlation with the depth into the substrate. Instead, within each of the platform regions 321 and 322, the dopant concentration levels do not vary much. As FIG. 7 illustrates, the dopant concentration levels within the platform region 321 appear to vary within an order of magnitude of other dopant concentration levels in the platform region 321. The same is true for the platform region 322.

The relative flatness of the platform regions 321 and 322 is a result of the melted and recrystallized silicon in the recrystallized layer. As silicon melts and takes on a liquid form, previously trapped dopant ions are now dissolved in the silicon and can move freely in the liquid silicon at a very fast speed. In this fashion, the dopant ions can be re-distributed from the more heavily doped regions near the back side to less doped regions further away from the back side. Consequently, the dopant concentration level may remain relatively steady across a certain distance, which may be the melting depth of the recrystallized layer. Past this distance, it may be harder for the dopant ions to reach those further regions. Thus, the dopant concentration level begins to decay rapidly as the depth into the substrate increases. In other words, beyond the recrystallized layer, the dopant concentration level is inversely correlated with the depth into the substrate. It is understood that due to the relatively high dopant concentration levels of the platform regions 321 and 322, these platform regions are associated with substantially lower resistivity compared to other parts of the curves 301 and 302.

It can also be seen that the platform region 322 of the curve 302 is longer and flatter than the platform region 321 of the curve 301. This is at least in part due to the higher annealing energy associated with the curve 302 (2.05 J/cm$^2$ VS 1.85 J/cm$^2$). Thus, the curve 302 may be associated with a greater melting depth 240 than the curve 301.

Experimental results have shown that, for the BSI image sensor device associated with the curve 301, its dark current is measured to be approximately 9.62 electrons/second, and its number of white pixels is approximately 9415. For the BSI image sensor device associated with the curve 302, its dark current is measured to be approximately 5.14 electrons/second, and its number of white pixels is approximately 6291. Thus, as discussed above, a greater melting depth achieved by the embodiments disclosed herein may substantially reduce the defects that lead to the dark current and white pixel problems.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating an image sensor device, comprising:

providing a substrate having a first side and a second side, the substrate containing a silicon material;

forming a radiation-sensitive element in the substrate, the radiation-sensitive element being configured to detect radiation that enters the substrate through the second side;

thereafter thinning the substrate from the second side;

implanting a dopant to the thinned substrate from the second side; and after the implanting, performing an annealing process to form recrystallized silicon in a first portion of the thinned substrate near the second side, wherein the annealing process comprises melting the silicon material in the first portion of the substrate and causing the melted silicon material to recrystallize, thereby forming the recrystallized silicon.

2. The method of claim 1, wherein the implanting is performed using:

an implantation energy between about 0.1 KeV and about 10 KeV; and an implantation dosage between about $1 \times 10^{12}$ atoms/cm$^2$ and about $1 \times 10^{15}$ atoms/cm$^2$.

3. The method of claim 1, wherein the implanting and the annealing process are performed such that the first portion of the substrate is within a thickness range between about 5 nanometers and about 200 nanometers.

4. The method of claim 1, wherein the annealing process is performed:

at an annealing energy level in a range between about 0.5 J/cm$^2$ to about 5 J/cm$^2$; and at a time duration between about 10 nanoseconds and about 1000 nanoseconds.

5. The method of claim 1, wherein the annealing process includes a laser annealing process.

6. The method of claim 1, further comprising, before the thinning:
   forming an interconnect structure over the first side of the substrate; and
   bonding the substrate to a carrier substrate such that the interconnect structure is disposed between the substrate and the carrier substrate.

7. The method of claim 1, further comprising, after the performing of the annealing process:
   forming an anti-reflective layer over the second side of the thinned substrate;
   forming a color filter over the anti-reflective layer; and
   forming a microlens over the color filter.

8. A method of fabricating an image sensor device, comprising:
   providing a substrate having a first side and a second side, the substrate containing a silicon material;
   forming a light-sensing element in the substrate, the light-sensing element being configured to sense light that enters the substrate through the second side;
   forming an interconnect structure over the second side of the substrate;
   bonding the second side of the substrate to a carrier substrate;
   thinning, after the bonding, the substrate from the second side;
   implanting a dopant to the thinned substrate from the second side; and
   thereafter performing a laser annealing an process to form melted and recrystallized silicon in a portion of the thinned substrate near the second side.

9. The method of claim 8, wherein the implanting is performed using:
   an implantation energy between about 0.1 KeV and about 10 KeV; and
   an implantation dosage between about $1\times10^{12}$ atoms/cm$^2$ and about $1\times10^{15}$ atoms/cm$^2$.

10. The method of claim 8, wherein the implanting and the annealing process are performed such that the portion of the substrate is within a thickness range between about 5 nanometers and about 200 nanometers.

11. The method of claim 8, wherein the annealing process is performed:
   at an annealing energy level in a range between about 0.5 J/cm$^2$ to about 5 J/cm$^2$; and
   at a time duration between about 10 nanoseconds and about 1000 nanoseconds.

12. A method of fabricating an image sensor device, comprising:
   providing a substrate having a front side and a back side;
   forming a radiation-sensing region in the substrate, the radiation-sensing region being operable to sense radiation projected toward the radiation-sensing region through the back side; and
   thereafter annealing the substrate in a manner so that a portion of the substrate near the back side is melted.

13. The method of claim 12, further comprising: before the annealing, implanting a dopant into the substrate from the back side.

14. The method of claim 13, wherein the implanting and the annealing are carried out in a manner so that the portion of substrate that is melted has a thickness than is in a range from approximately 5 nanometers to approximately 200 nanometers.

15. The method of claim 13, wherein the implanting includes:
   using an implantation energy that is in a range from approximately 0.1 KeV to approximately 50 KeV; and
   using an implantation dosage that is in a range from approximately $1\times10^{12}$ atoms/cm$^2$ to approximately $1\times10^{15}$ atoms/cm$^2$.

16. The method of claim 13, wherein the implanting and the annealing are carried out in a manner so that:
   the portion of the substrate is a first portion and has a first range of dopant concentration values;
   a second portion of the substrate that is mutually exclusive from the first portion has a second range of dopant concentration values; and
   each of the dopant concentration values in the first range is substantially greater than each of the dopant concentration values in the second range.

17. The method of claim 16, wherein each of the dopant concentration values in the first and second ranges is measured at, and associated with, a respective distance from the back side; and wherein:
   the dopant concentration values of the first portion of the substrate are each free of correlation with their associated distances and are within approximately one order of magnitude of one another; and
   the dopant concentration values of the second portion of the substrate are each inversely correlated with their associated distances.

18. The method of claim 12, wherein the annealing includes performing a laser annealing process at an annealing temperature that is greater than approximately 1414 degrees Celsius.

19. The method of claim 12, further comprising, before the annealing:
   forming an interconnect structure over the front side;
   bonding a carrier substrate to the interconnect structure; and
   thinning the substrate from the back side.

20. The method of claim 19, further comprising:
   forming an anti-reflective layer over the thinned substrate;
   forming a color filter over the anti-reflective layer; and
   forming a microlens over the color filter.

* * * * *